Figure 1:
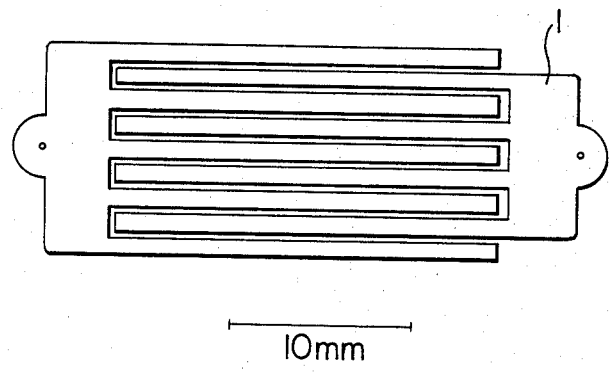

United States Patent [19]

Yanagida et al.

[11] Patent Number: 4,499,145
[45] Date of Patent: Feb. 12, 1985

[54] METAL-CLAD LAMINATE AND PROCESS FOR PRODUCING THE SAME

[75] Inventors: Tomomi Yanagida; Mitunori Ajiki; Shigeru Suzuki, all of Fujieda, Japan

[73] Assignee: Sumitomo Bakelite Company Limited, Tokyo, Japan

[21] Appl. No.: 480,034

[22] Filed: Mar. 29, 1983

[30] Foreign Application Priority Data

| Apr. 19, 1982 | [JP] | Japan | 57-64050 |
| Apr. 19, 1982 | [JP] | Japan | 57-64051 |
| Apr. 19, 1982 | [JP] | Japan | 57-64052 |
| Apr. 19, 1982 | [JP] | Japan | 57-64053 |
| Apr. 19, 1982 | [JP] | Japan | 57-64054 |
| Apr. 19, 1982 | [JP] | Japan | 57-64055 |

[51] Int. Cl.³ .......... B32B 15/08; B32B 27/06; C25D 5/56; C09J 5/02
[52] U.S. Cl. .................. 428/418; 428/419; 428/452; 428/457; 428/447; 428/464; 428/473.5; 428/513; 428/521; 428/531; 428/910; 428/901; 428/428; 428/702; 156/330; 156/307.3; 156/332
[58] Field of Search .......... 525/288, 342, 63, 64, 525/69; 428/418, 457, 901, 202, 209, 210, 336, 447, 910, 464, 419, 452, 513, 473.5, 521, 531; 156/330, 307.3, 332

[56] References Cited

U.S. PATENT DOCUMENTS

| 3,932,250 | 1/1976 | Sato | 156/213 |
| 3,984,598 | 10/1976 | Sarazin | 428/336 |
| 4,252,906 | 2/1981 | Hosokawa | 521/86 |
| 4,372,800 | 2/1983 | Oizumi | 156/307.3 |

FOREIGN PATENT DOCUMENTS 127438 4/1980 Japan.

Primary Examiner—Patricia C. Ives
Attorney, Agent, or Firm—Karl W. Flocks; Sheridan Neimark

[57] ABSTRACT

A metal-clad laminate comprising a base plate composed of a plurality of electrically insulating material layers and a metal foil or foils laminated on one side or both sides of the base plate, characterized in that to at least the metal foil or foils is laminated an electrically insulating material layer composed of a silane-modified polyethylene resin sheet, that to the silane-modified polyethylene resin is laminated an electrically insulating material layer made of a paper or cloth containing an epoxy resin and/or a silanol condensation catalyst, and that the layer made of a paper or cloth contains 5 to 35% by weight of an epoxy resin and/or that to the layer made of a paper or cloth is laminated an electrically insulating material layer other than the above-mentioned two layers. Said metal-clad laminate has excellent characteristics such as low, $\epsilon$, low tan $\delta$ and excellent moisture-resistant insulating property.

14 Claims, 1 Drawing Figure

10mm

10mm

METAL-CLAD LAMINATE AND PROCESS FOR PRODUCING THE SAME

This invention relates to a metal-clad laminate for an electronic circuit and a process for producing the same.

The recent innovation of electronic techniques increases the necessity for economically producing and supplying a base board for an electronic circuit which has good dielectic properties. However, conventional base boards have some disadvantages. There have heretofore widely been used laminates and copper-clad laminates of a glass fabric-epoxy resin type, a glass fabric/polyester cloth-epoxy resin type, a glass fabric-fluorine resin type and a thermoplastic resin type. However, in the case of the former two, their dielectric properties change greatly when printed circuit boards made of them are used at a high temperature and a high humidity (temperature: 40°-60° C., relative humidity: 70-100%). For example, as compared with regard to the dielectric properties (e.g., dielectric constant, dielectric loss tangent, electrostatic capacity, etc.) at ordinary temperature and ordinary humidity (temperature: 10°-40° C., relative humidity: 30-70%), the dielectric properties deteriorate greatly with the lapse of time.

Therefore, when such a printed circuit board is used, for example, in a color television set, and worked at a high temperature and a high humidity, sometimes, the images become indistinct or the color tone changes. Such a tendency for the characteristics originally fixed to change with the lapse of time is called "drift", and in many cases, drift due to temperature and drift due to humidity become problems. The drift under the high temperature-high humidity circumstances is said to be fundamentally attributable to the absorption of moisture by a printed circuit board due to the hydrophilic property of an epoxy resin constituting the element of the printed circuit board.

On the other hand, as a copper-clad laminate of a glass fabric-fluorine resin type has a very high hydrophobic property, the high-frequency properties of a printed circuit board produced by using the copper-clad laminate are excellent because of its small drift. However, said laminate is expensive and low in productivity, and the through-hole plating property at the time of processing the laminate into a printed circuit board is not satisfactory.

That is to say, in the case of copper-clay laminates of a glass fabric-fluorine resin type, the process for the production thereof is very complicated and the laminates are very expensive.

Further, adhesion between the glass filaments of the glass fabric and the fluorine resin is insufficient, and combination of the glass filaments and the fluorine resin is broken at the time of punching or drilling, so that the glass filaments are fluffily exposed and the so-called "punchability" is worse.

As copper-clad laminates of thermoplastic resin materials, there have been developed those of polysulfone resin sheets, those of polystyrene resin sheets, and those of a glass fabric-polyethylene resin type.

Printed circuit boards produced by using a copper-clad laminate of any of said thermoplastic resin materials are excellent in the temperature dependence and frequency dependence of the high-frequency properties, and are practically equal in these properties to those obtained by using a fluorine resin.

However, in the case of copper-clad laminates of polysulfone resin sheets, the polysulfone resin itself is poor in moisture resistance, and at a high temperature and a high humidity, the high-frequency properties deteriorate with the lapse of time and the electrostatic capacity between the circuits changes greatly. That is to say, a problem of drift is caused.

Copper-clad laminates of a polystyrene resin material and those of a polyethylene resin material are excellent in high-frequency properties, but are so poor in heat resistance that the resins soften at about 100° C. Accordingly, they are softened and deformed by various heat treatments in a usual process for the production of a printed circuit board, resulting in the occurence of warping, torsion, etc.

Further, difficulty in tightly sticking a metal foil to the surfaces of these thermoplastic resin boards is also a problem. Thermoplastic resin boards low in heat resistance show a certain degree of adhesion after being thermally fused onto metal foil, but at slightly higher temperatures, they tend to peel off spontaneously and the resin itself is liable to be deformed. Therefore, in general, thermoplastic resins high in heat resistance are utilized. However, these resins should be fused onto a metal foil at a high temperature corresponding to their heat resistance when a metal-clad laminate is laminated and hence are disadvantageous in that there tend to be caused such troubles that, for example, a conventional molding equipment cannot be used and the metal foil is oxidized and deteriorated owing to a too high molding temperature.

On the other hand, when a crosslinked polyethylene is used as the insulating layer, the resin itself possesses improved heat resistance, but its adhesion to metal is insufficient, and hence, the crosslinked polyethylene also is difficult to use practically.

In the fields of recent electronic industry and communication industry, the frequency band to be used shifts gradually to a higher-frequency range, namely, from the kilohertz range used frequently heretofore to a megahertz or gigahertz range. In these higher-frequency ranges, materials having a small tan $\delta$ have heretofore been particularly desired.

Studies were made in order to make crosslinkable polyethylene fit for practical use by taking advantage of its excellent characteristics such as a low $\epsilon$, a low tan $\delta$ and an excellent moisture-resistant insulating property, and as a result, this invention has been accomplished.

The object of this invention is to provide a metal-clad laminate for printed circuit board having the excellent properties that the drift of the high-frequency characteristics particularly at a high temperature and at a high humidity is small and the processability into a printed circuit board is good.

This object of this invention can be achieved by laminating a metal foil, a silane-modified polyethylene resin layer, a paper or cloth containing an epoxy resin and/or a silanol condensation catalyst, and an electrically insulating material layer in the specific order.

The process for producing the metal-clad laminate comprises laminating in a specific order, a metal foil, a closslinkable, silane-modified polyethylene resin sheet, and an expoxy resin prepreg or a paper or cloth to which a silanol condensation catalyst has been attached, and, if necessary, one or more sheets of an electrically insulating material which, together with said prepreg or paper or cloth, can integrally be formed into one body.

In this invention, as the metal foil, there may be used foils of copper, cupronickel, bronze, brass, aluminum, nickel, iron, stainless steel, gold, silver, platinum or the like. In general, copper foil for printed circuit has come into wide use, and it is a preferable metal foil in this invention. Further, among the copper foils, an oxygen-free copper foil of a very high purity is a metal foil most preferably used in this invention because when it is used, the energy loss in the transmission of high-frequency signals is small.

Moreover, the silane-modified polyethylene resin or the crosslinkable, silane-modified polyethylene resin is explained in detail below. Crosslinkable silane-modified polyethylene resins can be obtained by grafting a polyethylene resin on a silane of the general formula RR′SiY$_2$ (wherein R is a monovalent olefinic unsaturated group which is linked to the silicon atom through a silicon-carbon bond and comprises carbon, hydrogen and, if necessary, oxygen; each Y is a hydrolyzable organic group the two Y's may be identical or different; and R′ is a monovalent hydrocarbon group containing no aliphatic unsaturation or a group Y) at a temperature of 140° C. or more in the presence of a compound capable of generating a free radical which has a half-life at the reaction temperature of 6 minutes or less. That is to say, the crosslinkable, silane-modified polyethylene resin is a silane-modified polyethylene resin which has hardly undergone crosslinking reaction yet, and it fusible and soluble and becomes infusible and insoluble when the crosslinking reaction proceeds.

The polyethylene resin used in this invention includes polyethylene homopolymers, copolymers of an ethylene containing 50% or more by weight of ethylene and another monomer copolymerizable therewith, such as ethylene-vinyl acetate copolymers, ethylene-propylene copolymers, ethylene-acrylic acid copolymers and the like. Mixtures of two or more of these may also be used. Among them, ethylene homopolymer is most preferred from the viewpoint of the high-frequency properties.

In addition, flame retardants, agents for preventing deterioration by ultraviolet rays, antioxidants, agents for preventing damage by metals, coloring agents, fillers and the like may properly be used in admixture with the polyethylene resins in consideration of production processes and purposes.

In the general formula RR′SiY$_2$ for silane in the silane-modified polyethylene resin used in this invention, R is a monovalent olefinic unsaturated group comprising carbon, hydrogen and if necessary, oxygen, and each Y is a hydrolyzable organic group such as methoxy, ethoxy, acetoxy, —ON=C(CH$_3$)$_2$, —NHCH$_3$ or the like. The R′ group is a monovalent hydrocarbon group containing no aliphatic unsaturation or a group Y. Among such silanes, preferable are those having three hydrolyzable groups, and in particular, vinyltriethoxysilane and vinyltrimethoxysilane are most preferable.

An explanation is made below of the layer made of paper or cloth containing an expoxy resin and/or a silanol condensation catalyst (hereinafter referred to as "the substrate layer").

As the paper or cloth, there may be used woven or nonwoven fabric of glass fiber or inorganic or organic synthetic fiber, or linter paper, kraft paper, or the like.

When the substrate layer contains an epoxy resin, the epoxy resin content in the substrate layer is preferably lower than that of a usual epoxy resin-glass fabric laminate, and is usually 5 to 35% by weight, preferably 10 to 30% by weight, based on the weight of the paper or cloth plus any other constituents of the layer. When it is 35% by weight or more, the crosslinkable, silane-modified polyethylene resin which has not yet crosslinked is softened at the time of laminating by molding pressure and caused to slip out of place, and consequently dimensional precision and adhesion between layers are lowered. When it is less than 5%, the resulting laminate tends to have a lowered strength though this causes no particular problem in using the board. The higher the proportion of a polyethylene resin in the laminate structure, the stronger the above-mentioned tendencies.

A material for forming the substrate layer containing an epoxy resin is an expoxy resin prepreg or an epoxy resin prepreg containing a silanol condensation catalyst.

In the epoxy resin prepreg, as the epoxy resin, an optional epoxy resin may be used, and optional curing agents, accelerators and additives may also be used.

A novolak type epoxy resin may be used as a part of or the whole of said epoxy resin. The proportion of the novolak type epoxy resin used is preferably 10 to 40% by weight based on the weight of the whole resins. In this case, the resulting laminate is improved in adhesion between layers, heat resistance and laminatability.

It is also preferable to use a brominated epoxy resin.

The silane-modified polyethylene resin can be crosslinked without adding a silanol condensation catalyst to the expoxy resin prepreg, but the addition thereof is preferred from the viewpoint of crosslinking rate and crosslinking density.

At an epoxy resin content in the substrate layer of 15% by weight or more, when an epoxy resin prepreg containing a silanol condensation catalyst is produced, any content of the silanol condensation catalyst may be selected but is usually 0.1 part by weight or more and 20 parts by weight or less, preferably 3 parts by weight or more and 10 parts by weight or less, per 100 parts by weight of the epoxy resin. When the added amount thereof is too small, the silane-modified polyethylene resin has a low crosslinking rate and a low crosslinking density. When it is too large, there is a tendency that the catalyst is not miscible with the epoxy resin.

When the epoxy resin content in the substrate layer is less than 15% by weight, or when the substrate layer is a paper or cloth to which a silanol condensation catalyst has been attached, the content of the silanol condensation catalyst in the substrate layer is not critical but is preferably 0.5 to 10% by weight based on the weight of the paper or cloth in the substrate layer. When it is more than 10% by weight, the crosslinking rate of the silane-modified polyethylene resin is too high at the time of pressing and heating the laminate, so that the silane-modified polyethylene resin is crosslinked before being sufficiently bonded to the substrate, resulting in a tendency that the adhesion to the substrate is lowered. When it is smaller than 0.5% by weight, the effect of the catalyst on the crosslinking of the silane-modified polyethylene resin is insufficient.

When the substrate layer is a paper or cloth to which a silanol condensation catalyst has been attached, in a method of attaching the silanol condensation catalyst to the paper or cloth, there may be used a diluted solution of a silanol condensation catalyst in an organic solvent, or an emulsion of a silanol condensation catalyst. There may also be used a solution or dispersion prepared by dissolving or dispersing a silanol condensation catalyst in a diluted solution of a suitable curable resin.

Various substances having a function as a silanol condensation catalyst are known, and in this invention any of such substances may be used.

Such substances include, for example, a metal salts of carboxylic acids such as dibutyltin dilaurate, stannous acetate, stannous caprylate, lead naphthenate, zinc caprylate, iron 2-ethylcaproate and cobalt naphthenate; organic metal compounds such as esters and chelates of titanium, e.g., tetrabutyl titanate, tetranonyl titanate and bis(acetylacetonyl)-diisopropyl titanate; organic bases such as ethylamine, hexylamine, dibutylamine and pyridine; and acids such as mineral acids and fatty acids. Among them, organic tin compounds, in particular, those having a low molecular weight such as dioctyltin maleate, monobutyltin oxide, dibutyltin dilaurate, dibutyltin diacetate, dibutyltin chloride and the like are preferred from the viewpoint of adhesion between layers and heat resistance.

The electrically insulating material layers other than those described above are such as cured products of various thermosetting resins other than epoxy resins; thermoplastic resins, mica, ceramics and the like, and they may be used alone or in combination.

The material used for forming the electrically insulating layer is "one or more sheets of an electrically insulating material which can be integrally laminated to the substrate layer by heating and pressing". As said material, there may be used various materials such as fusible thermosetting resins, prepregs prepared by impregnating or coating an insulating material therewith, sheets of cured products of said prepregs, sheet of thermoplastic resins, natural or synthetic mica, ceramics, mixed materials thereof, etc.

Among them, prepregs of phenolic resins, polyester resins, curable polybutadienes or polyimide resins or cured products thereof are preferred. It is preferable to use a material which is good in heat-resistance and excellent in dielectric properties and electrical insulation, for example, thermoplastic resins having a heat deformation temperature of 130° C. or higher, such as polysulfones, polyethersulfones, polyphenylene sulfides, polyetheretherketones, polyphenylene oxides, polyetherimide, nylon and the like.

By use of these materials, there can be obtained a circuit base board which is particularly excellent in moisture-resistant dielectric properties on the surface of the circuit board and is exactly equal in circuit workability to ordinary laminated.

When the materials described above are laminated in the specific order, a printed circuit board made of the resulting metal-clad laminate has very excellent characteristics as described below.

The first point is that since the insulating layer in contact with a circuit is a polyethylene resin high in hydrophobicity, the metal-clad laminate in this invention is very excellent in water resistance, so that the drift of the high-frequency characteristics at a high temperature and at a high humidity can be kept slight, and at the same time, the mechanical strength of the metal-clad laminate can be increased owing to a substrate layer in contact with the polyethylene resin layer. When the substrate layer contains an epoxy resin, it is superior to the substrate layer free from epoxy resin in the fixation of the substrate with the resin, and hence is superior thereto also in punchability.

The second point is that when the electrically insulating layer is a layer of cured resin, a thermoplastic resin layer having a heat deformation temperature of 130° C. or more, or a combination thereof, there can be obtained a printed circuit base board which possesses therein the electrically insulating layer good in mechanical strength, dimensional stability, heat resistance and the like, and is excellent in dielectric properties. Particularly when the insulating layer has a small dielectric constant and a small dielectric loss, there can be obtained a circuit board showing a small dielectric constant and a small dielectric loss not only in the circuit on the surface but in all the layers in the base board.

The third point is that when the substrate layer contains an epoxy resin, the simultaneous use of an epoxy resin prepreg or an epoxy resin prepreg containing a silanol condensation catalyst and a sheet of a crosslinkable silane-modified polyethylene resin brings about a very strong adhesion between metal foil and said sheet.

Further, when the substrate layer is a paper or cloth to which a silanol condensation catalyst has been attached, adhesion between said paper or cloth and the silane-modified polyethylene sheet is also tight.

The fourth point is that when the insulating base plate has such a structure that the whole of both sides is covered with a silane-modified polyethylene resin layer, the metal-clad laminate according to this invention is decreased in deterioration in the electrical properties due to the absorption of moisture or water, owing to the very high hydrophobicity of the silane-modified polyethylene.

A concrete example of the application of this method is suitably the use of a polyethersulfone or an epoxy resin in the electrically insulating layer.

Although polyethersulfones, in particular, are representative materials excellent in heat resistance, dimensional stability and dielectric properties, but, regrettably, deteriorate seriously owing to moisture absorption, the application of this invention makes it possible to obtain a metal-clad laminate in which both the surface of the circuit board and the whole of the layers have excellent dielectric properties and which hardly absorbs moisture and hardly deteriorates upon absorption of moisture.

The fifth point is that the metal-clad laminate according to this invention has such a structure that the surface layer in an insulating base plate is a soft and durable silane-modified polyethylene resin layer; the second layer is a durable reinforcing substrate; and the whole surface of the insulating base board is protected with these layers. Particularly when the second layer contains an epoxy resin, the resulting metal-clad laminate has a very durable and reliable structure even if a material having a relatively low strength is selected from the electrically insulating layer, as a material excellent in dielectric properties.

The sixth point is that when the substrate layer contains an epoxy resin, an epoxy resin prepreg and an electrically insulating material are brought into contact with each other and pressed and heated, whereby any of various electrically insulating material sheets such as a thermosetting resin prepreg, a cured product sheet, a thermoplastic resin sheet and the like is tightly laminated to the substrate layer since the epoxy resin shows an adhering effect, so that a complex having a tight adhesion between layers can be produced. Accordingly, it has become possible to easily utilize, for example, thermoplastic resins having a high heat deformation temperature which have heretofore been troublesome in utilizing as metal-clad laminates.

Particularly in this case, an epoxy resin prepreg containing a silanol condensation catalyst is preferred as the epoxy resin prepreg. This is because the crosslinking of the silane-modified polyethylene resin proceeds more effectively and the heat resistance is more improved.

This point is explained below in more detail.

In general, a copper-clad laminate in which the insulating layer is a thermoplastic resin sheet having a high heat deformation temperature is very difficult to produce when it is taken into consideration that the temperature for usual steam press is relatively low (160° C. or lower). That is to say, at a temperature of about 160° C., a thermoplastic resin having a high heat deformation temperature (130° to 260° C.) cannot be melted. Therefore, there is known a technique comprising inserting an epoxy resin prepreg between a thermoplastic resin sheet and a metal foil, and integrally forming them into one body by heating and pressing. However, in this case, the insulating layer adjacent to the circuit of the resulting printed circuit board is the epoxy resin, so that the thermoplastic resin cannot be allowed to exhibit its inherent, excellent high-frequency characteristics.

According to the present invention, such problems can be solved, and a laminate in which the main insulating layer is a thermoplastic resin sheet having a high heat deformation temperature, also can easily be formed into a metal-clad laminate by usual steam press.

That is to say, in the metal-clad laminate of this invention, the electrically insulating layer directly adjacent to a circuit is a silane-modified polyethylene resin sheet and hence excellent in high-frequency properties, and it and a thermoplastic resin sheet are tightly united into a body through an epoxy resin prepreg.

There is given below a supplementary description of a case where in this invention, the substrate layer contains an epoxy resin. Adhesion between the epoxy resin layer and the electrically insulating material layer is mainly due to thermal fusion with each other or chemical bonding, and particularly when the electrically insulating material layer is a thermoplastic resin sheet, it is preferable to previously roughen the surface of said sheet mechanically or chemically.

In the mechanical surface-roughening treatment, sandblast or liquid horning is effective. However, other methods may be used so long as uniform and elaborate roughening can be achieved.

In the chemical surface-roughening treatment, there may be applied, for example, roughening by means of an oxidizing agent such as a mixed solution of chromic acid and sulfuric acid, hydrogen peroxide or the like, and roughening by irradiation with electron beam, ion beam or ultraviolet light.

As described above, a metal-clad laminate obtained according to this invention can provide an economical printed circuit board which is excellent not only in water resistance and dielectric properties but also in circuit workability, namely, dimensional stability to heat treatment, punching workability and cutting workability.

Only glass fabric-fluorine resin copper-clad laminates have heretofore almost satisfied said properties, but they have been poor in punching workability and cutting workability.

The metal-clad laminate of this invention fundamentally has the characteristics of glass fabric-fluorine resin copper-clad laminates, and provides a printed circuit board improved also in punching workability and cutting workability.

As to uses, said metal-clad laminate is a base board suitable mainly for high-frequency circuits, and is particularly suitable for printed circuit boards for high-speed computers or communicating machinery and tools.

This invention can provide a printed circuit board which has a small dielectric constant and a small dielectric loss, is only slight in temperature dependence and frequency dependence of dielectric properties, and shows very stable dielectric properties even at a high temperature and a high humidity.

This invention is further explained below referring to Examples and the accompanying drawing, which show a plan view of a pattern used in the measurement of drift of electrostatic capacity between combshaped circuits.

The materials shown in Table 2 were laminated as metal foil, a sheet of a crosslinkable, silane-modified polyethylene resin, an epoxy resin prepreg or paper or cloth to which a silanol condensation catalyst has been attached, and an electrically insulating material in that order, and then integrally formed into one body by heating at a pressing pressure of 60 kg/cm$^2$ at 160° C. for 120 minutes in all the cases, whereby metal-clad laminates were obtained. Their properties are given in Table 2.

The materials in Table 2 are explained below in detail.

(1) Metal foil

Copper foil: electrolytic copper foil NSGA-35 manufactured by Nippon Electrolysis Co., Ltd. (one side was roughened, 35µ thick).

Nickel foil: electrolytic nickel foil (one side was roughened, 35µ thick).

(2) Crosslinkable, silane-modified polyethylene resin sheet

U-1

To 100 parts by weight of high-density polyethylene (Sholex ® manufactured by Showa Yuka Co., Ltd., MI=0.8 g/10 min) were added 2 parts by weight of vinyltrimethoxysilane, 0.2 part by weight of dicumyl peroxide, and suitable amounts of an antioxidant, an agent for preventing deterioration by harmful effects of minerals, and the like which were commercially available, and they were sufficiently blended, after which the resulting mixture was extruded into a strand by means of an extruder, and cut to be granulated. The thus obtained pellets were made into sheet (U-1) of 200 µm in thickness by inflation molding.

U-2

To 70 parts by weight of a low-density polyethylene (Sumikathene ® manufactured by Sumitomo Chemical Co., Ltd., MI=1.5 g/10 min) were added 1.5 parts by weight of vinyltriethoxysilane, 0.1 part by weight of dicumyl peroxide, 20 parts by weight of Dechrorane Plus 25 manufactured by Hooker Chemical Co., Ltd. as a halogen-containing flame-retardant, 10 parts by weight of antimony oxide, and suitable amounts of an antioxidant, an agent for preventing deterioration by harmful effects of minerals, and the like which were commercially available, and they were sufficiently blended, after which the resulting mixture was extruded into a strand by means of an extruder and granulated. The thus obtained pellets were formed into sheet (U-2) of 200 µm in thickness by extrusion molding.

(3) Epoxy resin prepreg or substrate cloth

The recipies shown in Table 1 were used.

TABLE 1

| Constituent | E-1[3] | E-2 | E-3 | E-4 | E-5 | E-6 | E-7 | E-8 | E-9 |
|---|---|---|---|---|---|---|---|---|---|
| Epicote 1046[1] | 85 | 85 | 85 | 85 | 100 | 85 | 85 | 85 | 85 |
| EPC-N-673[2] | 15 | 15 | 15 | 15 | — | 15 | 15 | 15 | 15 |
| Dicyandiamide | 4 | 4 | 4 | 4 | 4 | 4 | 4 | 4 | 4 |
| Benzyldimethylamine | 0.5 | 0.5 | 0.5 | 0.5 | 0.5 | 0.5 | 0.5 | 0.5 | 0.5 |
| Dioctyltin maleate | 9.0 | 3.5 | 3.5 | 3.5 | 3.5 | — | — | — | 7.0 |
| Monobutyltin oxide | — | — | — | — | — | 3.5 | — | — | — |
| Dibutyltin dilaurate | — | — | — | — | — | — | 3.5 | — | — |
| Epoxy resin content of prepreg (wt %) | 10 | 22 | 30 | 45 | 22 | 22 | 22 | 22 | 22 |

[1] Bisphenol A type brominated epoxy resin (Shell Chemical) epoxy equivalent 500, Br content 20%
[2] Cresol-novolak type epoxy resin (DAINIPPON INK AND CHEMICAL) epoxy equivalent 200
[3] The amount of dioctyltin maleate attached to a substrate was adjusted to 1.0% by weight.

Each of epoxy resin compositions according to the above recipes was made into a solution in methyl Cellosolve and methyl ethyl ketone (1:1), and the solution was applied to a glass fiber cloth of 0.18 mm in thickness and dried.

G-1: A glass fiber cloth of 0.18 mm in thickness was impregnated with a 3% by weight xylene solution of dioctyltin maleate and then dried to obtain a substrate cloth to which 1.0% by weight of dioctyltin maleate had been attached.

G-2: An untreated glass fiber cloth of 0.18 mm in thickness.

(4) Electrically insulating material

U-1, U-2, E-3 were as explained above.

Polyethersulfone sheet (1.0 mm thick) Victlex® 520P (Sumitomo Chemical) which is a material containing 20% of glass fiber and has a softening temperature of 230° C.

Polyetherimide sheet (1.0 mm thick) ULTEM® 1000 (Engineering Plastic)

Polysulfone sheet (1.0 mm thick) UDEL® P-3500 (Union Carbide).

TABLE 2

Combination of materials

| Example | | Metal foil | Cross-linkable, silane-modified polyethylene resin | Epoxy resin prepreg or substrate cloth | Electrically insulating material | Epoxy resin prepreg or substrate cloth | Cross-linkable, silane-modified polyethylene resin | Metal foil |
|---|---|---|---|---|---|---|---|---|
| 1 | a | Copper foil | U-1 | E-2 | U-1 | E-2 | U-1 | Copper foil |
| | b | " | " | " | " | " | " | — |
| | c | " | " | " | " | " | — | — |
| 2 | a | " | U-2 | E-1 | — | — | U-2 | Copper foil |
| | b | " | " | " | — | — | " | — |
| 3 | a | " | " | E-2 | — | — | " | Copper foil |
| | b | " | " | " | — | — | " | — |
| 4 | a | " | " | " | U-2, U-2, E-2, U-2, U-2 were laminated in this order | E-2 | " | Copper foil |
| | b | " | " | " | U-2, U-2, E-2, U-2, U-2 were laminated in this order | " | " | — |
| | c | " | " | " | U-2, U-2, E-2, U-2, U-2 were laminated in this order | " | — | — |
| 5 | a | Nickel foil | " | " | — | — | U-2 | Nickel foil |
| | b | " | " | " | — | — | " | — |
| 6 | a | Copper foil | " | E-3 | — | — | " | Copper foil |
| | b | " | " | " | — | — | " | — |
| 7 | a | " | " | E-5 | — | — | " | Copper foil |
| 8 | a | " | " | E-6 | — | — | " | Copper foil |
| | b | " | " | " | — | — | " | — |
| 9 | a | " | " | E-7 | — | — | " | Copper foil |
| | b | " | " | " | — | — | " | — |
| 10 | a | " | " | E-8 | — | — | " | Copper foil |
| 11 | a | " | " | E-9 | — | — | " | Copper foil |
| | b | " | " | " | — | — | " | — |
| 12 | a | " | U-1 | E-2 | Polyethersulfone | E-2 | U-1 | Copper foil |
| | b | " | " | " | " | " | " | — |
| | c | " | " | " | " | " | — | — |
| 13 | a | " | " | E-1 | " | E-1 | U-1 | Copper foil |
| | b | " | " | " | " | " | " | — |
| 14 | a | " | " | E-2 | " | E-2 | " | Copper foil |
| | b | " | " | " | " | " | " | — |
| | c | " | " | " | " | " | — | — |
| 15 | a | " | " | " | Polyetherimide | E-2 | U-1 | Copper foil |
| | b | " | " | " | " | " | " | — |
| 16 | a | " | " | " | Polysulfone | " | " | Copper foil |
| | b | " | " | " | " | " | " | — |
| 17 | a | Nickel foil | U-2 | " | Polyethersulfone | " | U-2 | Nickel foil |

TABLE 2-continued

| | | | Combination of materials | | | | |
|---|---|---|---|---|---|---|---|
| | | | | Material | | | |
| | Metal foil | Cross-linkable, silane-modified polyethylene resin | Epoxy resin prepreg or substrate cloth | Electrically insulating material | Epoxy resin prepreg or substrate cloth | Cross-linkable, silane-modified polyethylene resin | Metal foil |
| b | " | " | " | " | " | " | — |
| 18 a | Copper foil | " | E-3 | " | E-3 | " | Copper foil |
| b | " | " | " | " | " | " | — |
| 19 a | " | " | E-5 | " | E-5 | " | Copper foil |
| b | " | " | " | " | " | " | — |
| 20 a | " | " | E-6 | " | E-6 | " | Copper foil |
| b | " | " | " | " | " | " | — |
| 21 a | " | " | E-9 | " | E-9 | " | Copper foil |
| b | " | " | " | " | " | " | — |
| Comparative Example | | | | | | | |
| 1 a | " | " | G-1 | — | — | " | Copper foil |
| b | " | " | " | — | — | " | — |
| 2 a | " | " | E-4 | — | — | " | Copper foil |
| b | " | " | " | — | — | " | — |
| 3 a | " | " | G-2 | U-2,U-2,G-2, U-2, U-2 were laminated in this order | G-2 | " | Copper foil |
| b | " | " | " | U-2,U-2,G-2, U-2, U-2 were laminated in this order | " | " | — |
| 4 a | " | " | — | U-2 (3 layers) | — | " | Copper foil |
| 5 a | " | — | E-2 | Polyethersulfone | E-2 | — | " |
| 6 | Sumilite ® | ELC-4762 (Epoxy glass copper-clad laminate, FR-4 grade) (Sumitomo Bakelite) | | | | | |
| 7 | Sumilite ® | ELC-4830 (Epoxy glass/polyester copper-clad laminate) (Sumitomo Bakelite) | | | | | |
| 8 | OAK-602 | (Teflon glass copper-clad laminate) (Oak) | | | | | |
| 9 | G-60 | (Polysulfone copper-clad laminate) (Noplex) | | | | | |

Explanation of test methods of estimation items.

Dielectric constant and dielectric loss tangent were according to JIS C 6481. The test method for drift was as follows:

Comb-shaped circuits as shown in the FIGURE were prepared, and the electrostatic capacity between circuits was measured. When it is assumed that the electrostatic capacity at 20° C. and at a relative humidity of 65% is $Cx_0$ and the electrostatic capacity after treatment at 60° C. and at a relative humidity of 90% for 240 hrs is $Cx_1$, the drift can be given by the following equation:

$$\text{Drift (\%)} = \{(Cx_1 - Cx_0)/Cx_0\} \times 100.$$

The water absorption, peeling strength and soldering heat resistance were according to JIS C 6481. The punchability was according to ASTM. The adhesion between layers was measured according to the following method:

A test piece having a length of 100 mm and a width of 10 mm was allowed to stand in air at 150° C. for one hour and then subjected to measurement in an atmosphere at 150° C.

From the surface side, the metal foil and the cross-linked polyethylene resin sheet layer were integrally formed into one body, and this body was peeled from a third layer in the vertical direction (the peel strength of this body from the third layer in the vertical direction was measured).

The soldering heat resistance after water absorption by boiling was measured by the following method:

A test piece having a size of 25 mm × 25 mm was immersed in boiling water for one hour, and then put on the surface of a solder bath at 260° C. so that the metal surface faced the bath for 10 sec, after which blistering and appearance were observed.

The laminatability was measured by the following method:

The assembly of fixed combination of sheet materials having a size of 50 cm × 50 cm was pressed under the conditions that the pressure was 60 kg/cm², the temperature was 160° C. and the time was two hours. The maximum distance between the edge of the silane-modified polyethylene resin layer flowing out and the each edge of the metal-clad laminate was measured and this was indicated as laminatability.

TABLE 3

| Estimation items | Dielectric constant (1 MHz) | Dielectric loss tangent × 10⁴ (1 MHz) | Drift of electrostatic capacity (%) | Water absorption (%) | Peel strength (Kg/cm) | Soldering heat resistance (sec/260° C.) | Punchability | Adhesion between layers at high temperatures (in atmosphere at 150° C.) (Kg/cm) | soldering heat resistance after water absorption by boiling (Appearance change) | Laminatabiliy (cm) |
|---|---|---|---|---|---|---|---|---|---|---|
| Example No. | | | | | | | | | | |
| 1 a | 3.0 | 25 | 1.0 | 0.02 | 2.0 | 20< | Good | 0.08 | Nothing | 1 |
| b | 3.0 | 25 | 1.0 | 0.02 | 2.0 | " | " | " | " | 1 |
| c | 3.2 | 35 | 1.5 | 0.02 | 2.0 | " | " | " | " | 1 |
| 2 a | 2.9 | 20 | 0.9 | 0.02 | 2.1 | " | " | 0.07 | " | 0 |
| b | 2.9 | 20 | 1.0 | 0.02 | 2.2 | " | " | " | " | 0 |
| 3 a | 2.9 | 20 | 1.0 | 0.02 | 2.1 | " | " | 0.09 | " | 0 |
| b | 2.9 | 20 | 1.0 | 0.02 | 2.1 | " | " | " | " | 0 |

TABLE 3-continued

| Estimation items | Dielectric constant (1 MHz) | Dielectric loss tangent × 10⁴ (1 MHz) | Drift of electrostatic capacity (%) | Water absorption (%) | Peel strength (Kg/cm) | Soldering heat resistance (sec/260° C.) | Punchability | Adhesion between layers at high temperatures (in atmosphere at 150° C.) (Kg/cm) | soldering heat resistance after water absorption by boiling (Appearance change) | Laminatabiliy (cm) |
|---|---|---|---|---|---|---|---|---|---|---|
| 4 a | 2.9 | 20 | 1.0 | 0.02 | 2.0 | " | " | 0.10 | " | 1 |
| b | 2.9 | 20 | 1.0 | 0.02 | 2.0 | " | " | | " | 1 |
| c | 3.0 | 30 | 1.5 | 0.03 | 2.0 | " | " | | " | 0 |
| 5 a | 2.9 | 20 | 1.0 | 0.02 | 2.0 | " | " | 0.07 | " | 0 |
| b | 2.9 | 20 | 1.0 | 0.02 | 1.9 | " | " | | " | 0 |
| 6 a | 2.9 | 20 | 1.0 | 0.01 | 1.9 | " | " | 0.08 | " | 5 |
| b | 2.9 | 20 | 1.0 | 0.01 | 2.2 | " | " | | " | 3 |
| 7 a | 2.9 | 20 | 1.0 | 0.02 | 2.0 | " | " | 0.10 | " | 1 |
| 8 a | 2.9 | 20 | 0.9 | 0.02 | 1.7 | " | " | 0.12 | " | 1 |
| 8 b | 2.9 | 20 | 1.2 | 0.02 | 1.6 | " | " | | " | 1 |
| 9 a | 2.9 | 20 | 1.0 | 0.02 | 2.0 | " | " | 0.08 | " | 0 |
| b | 2.9 | 20 | 1.0 | 0.02 | 2.0 | " | " | | " | 1 |
| 10 a | 2.9 | 20 | 1.0 | 0.02 | 1.9 | " | " | 0.08 | Changed (Slightly blistered) | 1 |
| 11 a | 2.9 | 20 | 0.9 | 0.02 | 2.0 | " | " | 0.10 | Nothing | 1 |
| b | 2.9 | 20 | 1.0 | 0.02 | 2.1 | " | " | | " | 0 |
| 12 a | 3.2 | 30 | 1.0 | 0.05 | 2.0 | " | " | 0.08 | " | 0 |
| b | 3.2 | 30 | 1.0 | 0.05 | 1.9 | " | " | | " | 0 |
| c | 3.5 | 35 | 1.5 | 0.10 | 2.0 | " | " | | " | 0 |
| 13 a | 3.4 | 40 | 1.2 | 0.04 | 1.8 | " | " | 0.06 | " | 1 |
| b | 3.4 | 40 | 1.2 | 0.04 | 1.9 | " | " | | " | 1 |
| 14 a | 3.5 | 40 | 1.0 | 0.02 | 2.0 | " | " | 0.09 | " | 1 |
| b | 3.4 | 40 | 1.1 | 0.02 | 2.0 | " | " | | " | 1 |
| c | 3.8 | 50 | 1.2 | 0.05 | 1.9 | " | " | | " | 0 |
| 15 a | 3.3 | 35 | 1.2 | 0.03 | 2.0 | " | " | 0.12 | " | 0 |
| b | 3.4 | 35 | 1.2 | 0.04 | 1.9 | " | " | | " | 0 |
| 16 a | 3.9 | 100 | 3 | 0.02 | 1.9 | " | " | 0.10 | " | 0 |
| b | 3.9 | 100 | 3 | 0.03 | 1.9 | " | " | | " | 0 |
| 17 a | 3.5 | 40 | 1.5 | 0.05 | 1.6 | " | " | 0.09 | " | 0 |
| b | 3.5 | 40 | 1.5 | 0.07 | 1.8 | " | " | | " | 0 |
| 18 a | 3.5 | 40 | 1.4 | 0.05 | 2.0 | " | " | 0.10 | " | 5 |
| b | 3.5 | 40 | 1.3 | 0.05 | 2.0 | " | " | | " | 4 |
| 19 a | 3.5 | 40 | 1.4 | 0.05 | 2.0 | " | " | 0.10 | " | 1 |
| b | 3.5 | 40 | 1.4 | 0.04 | 2.0 | " | " | | " | 1 |
| 20 a | 3.7 | 40 | 1.3 | 0.04 | 1.7 | " | " | 0.12 | " | 1 |
| b | 3.5 | 40 | 1.3 | 0.04 | 1.6 | " | " | | " | 1 |
| 21 a | 3.5 | 40 | 1.2 | 0.05 | 2.0 | " | " | 0.08 | " | 1 |
| b | 3.5 | 40 | 1.4 | 0.04 | 2.0 | " | " | | " | 1 |
| Comparative Example | | | | | | | | | | |
| 1 a | 2.8 | 15 | 0.8 | 0.02 | 1.8 | " | No good | 0.03 | " | 1 |
| b | 2.8 | 15 | 0.8 | 0.07 | 1.8 | " | No good | " | " | |
| 2 a | 2.9 | 20 | 1.0 | 0.02 | 2.0 | " | Good | 0.08 | " | 15 |
| b | 2.9 | 20 | 0.9 | 0.02 | 2.0 | " | " | " | " | |
| 3 a | 2.8 | 15 | 2.0 | 0.02 | 1.0 | Reformed | No good | 0.03 | Changed (blistered) | 1 |
| b | 2.8 | 15 | 2.0 | 0.02 | 0.8 | " | No good | | " | |
| 4 a | 2.4 | 10 | 0.5 | 0.01 | 0.8 | Deformed | Good | — | Deformed | — |
| 5 a | 3.8 | 70 | 5.0 | 0.02 | 2.2 | 20< | No good | — | Nothing | — |
| 6 | 4.4 | 250 | 5.0 | 0.3 | 2.0 | " | No good | — | " | — |
| 7 | 3.5 | 150 | 3.0 | 0.2 | 1.9 | " | Good | — | " | — |
| 8 | 2.8 | 10 | 1.5 | 0.01 | 3.0 | " | No good | — | " | — |
| 9 | 3.5 | 35 | 1.5 | 0.5 | 1.6 | 10 | Good | — | Changed (blistered) | — |

The Examples are compared with the Comparative Examples. All the Examples are small in drift, excellent in dielectric characteristics and good in general characteristics such as water absorption and the like. The characteristics shown in Table 3 do not show great difference, but the larger the amount of the silanol condensation catalyst added, the better the characteristics after the heat-treatment.

The adhesion between the metal foil and the polyethylene layer is good in almost all cases, and is not so much affected by the amount of the silanol condensation catalyst added.

The adhesion between layers at high temperatures is decreased when the amount of the epoxy resin in the substrate layer is extremely small, and it is also decreased when the silanol condensation catalyst is absent.

As for the soldering heat resistance after boiling there is a tendency that said soldering heat resistance is better where a novolak type epoxy resin is contained in the epoxy resin in the paper or cloth and is reduced in the absence of a silanol condensation catalyst.

The laminatability becomes extremely inferior and a warpage of the laminate produced by using it is caused when the content of the epoxy resin in the epoxy resin prepreg becomes too high.

Comparative Example 1 is the case where no epoxy resin was contained in the paper or cloth, and is inferior in punchability, adhesion between layers at high temperature, and then practicability. Comparative Example 2 is the case where the content of the epoxy resin in the epoxy resin prepreg is as high as 45%, and is inferior in laminatability and not practicable.

Comparative Example 3 is the case where untreated glass fiber cloth is used as the paper or cloth, and is inferior in soldering heat resistance and guite unpracticable. Comparative Example 4 is the case where no paper or cloth is used, and is inferior in soldering heat resistance and unpracticable. Comparative Example 5 is the case where no crosslinked polyethylene layer is used, and is inferior in dielectric characteristics and drift, and the metal-clad laminate obtained in Comparative Example 5 is not so different from a conventional epoxy resin-glass fabric metal-clad laminate.

Comparative Examples 6 and 7 are inferior in dielectric characteristics, drift and the like, and Comparative Example 8 is inferior in cutting workability and punchability as is Comparative Example 1. The glass fibers are not sufficiently bonded to the resins, and hence, they are exposed on the processed surface. Comparative Example 9 is inferior in moisture-resistance and soldering heat resistance.

As stated above, each Example of this invention shows excellent electric characteristics and well-balanced general characteristics as a base board for electric circuit as compared with corresponding Comparative Example. Furthermore, the method for producing the metal-clad laminate of this invention is easy and highly practicable.

What is claimed is:

1. A metal-clad laminate comprising:
   a base plate; and
   a layer of metal foil on at least one side of said base plate;
   said base plate including, in order, a first electrically insulating material layer composed of a cross-linked silane-modified polyethylene resin laminated to a layer of said metal foil, and a second electrically insulating material layer made of paper or cloth containing an epoxy resin, a silanol condensation catalyst or a mixture of said epoxy resin and said silanol condensation catalyst laminated to said first electrically insulating layer.

2. A metal-clad laminate according to claim 1, wherein the paper or cloth layer contains a silanol condensation catalyst.

3. A metal-clad laminate according to claim 2, wherein the silanol condensation catalyst is an organic tin compound.

4. A metal-clad laminate according to claim 3, wherein the silanol condensation catalyst is at least one member selected from dioctyltin malate, monobutyltin oxide, dibutyltin dilaurate, dibutyltin chloride and dibutyltin diacetate.

5. A metal-clad laminate according to claim 2, wherein the amount of the silanol condensation catalyst is 3 to 10% by weight based on the weight of the epoxy resin when the epoxy resin content of the paper or cloth layer is 15% by weight of more, and it is 0.5 to 2% by weight based on the weight of the paper or cloth in the layer when the epoxy resin content is less than 15% by weight.

6. A metal-clad laminate according to claim 1, wherein the paper or cloth layer contains an epoxy resin.

7. A metal-clad laminate according to claim 6, wherein the amount of the epoxy resin contained in the paper or cloth layer is 5 to 35% by weight based on the weight of the paper or cloth plus any other constituents of the layer.

8. A metal-clad laminate according to claim 6, wherein the amount of the epoxy resin contained in the paper or cloth layer is 10 to 30% by weight based on the weight of the paper or cloth plus any other constituents of the layer.

9. A metal-clad laminate according to claim 6, further comprising a third electrically insulating layer laminated to the paper or cloth, said third electrically insulating layer comprising a thermoplastic resin having a heat deformation temperature of 130° C. or higher.

10. A metal-clad laminate according to claim 9, wherein the thermoplastic resin of said third electrically insulating layer is a polyethersulfone, a polysulfone, a polyphenylene sulfide, a polyetheretherketone, a polyphenylene oxide or a polyetherimide.

11. A metal-clad laminate according to claim 1, comprising layers laminated in the order of the metal foil, the cross-linked silane-modified polyethylene resin layer, the paper or cloth, a third cross-linked silane-modified polyethylene resin layer and a second layer of metal foil.

12. A metal-clad laminate according to claim 1, which has a metal foil on only one surface laminated to the base plate and has an electrically insulating layer made of a cross-linked silane-modified polyethylene resin on the other surface.

13. A process for producing a metal-clad laminate of claim 1, characterized by laminating a metal oil and at least the following electrically insulating materials and integrally forming them into one body by heating and pressing:
   (a) a crosslinkable, silane-modified polyethylene sheet, and
   (b) a paper or cloth containing an epoxy resin, a silanol condensation catalyst or a mixture thereof.

14. A process according to claim 13, wherein the paper or cloth contains an epoxy resin and said epoxy resin comprises 10 to 40% by weight of a novolak type epoxy resin based on the total weight of the epoxy resin.

* * * * *